(12) United States Patent
Lee

(10) Patent No.: US 9,930,784 B2
(45) Date of Patent: Mar. 27, 2018

(54) DISPLAY DEVICE HAVING DUMMY TERMINALS

(71) Applicant: SAMSUNG DISPLAY CO., LTD., Yongin-si, Gyeonggi-do (KR)

(72) Inventor: Dong Sun Lee, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/208,247

(22) Filed: Jul. 12, 2016

(65) Prior Publication Data

US 2017/0164478 A1 Jun. 8, 2017

(30) Foreign Application Priority Data

Dec. 3, 2015 (KR) .................. 10-2015-0171534

(51) Int. Cl.
| | |
|---|---|
| *H05K 1/18* | (2006.01) |
| *H05K 1/11* | (2006.01) |
| *H01L 51/52* | (2006.01) |
| *G02F 1/1345* | (2006.01) |

(52) U.S. Cl.
CPC ......... *H05K 1/181* (2013.01); *G02F 1/13458* (2013.01); *H01L 51/52* (2013.01); *H05K 1/111* (2013.01); *H05K 2201/0979* (2013.01); *H05K 2201/09781* (2013.01); *H05K 2201/10128* (2013.01); *Y02P 70/611* (2015.11)

(58) Field of Classification Search
CPC ..... H05K 1/111; H05K 1/117; H05K 1151/52
See application file for complete search history.

(56) References Cited

U.S. PATENT DOCUMENTS

| | | | |
|---|---|---|---|
| 2009/0237903 A1* | 9/2009 | Onodera | G02F 1/1345 361/780 |
| 2009/0251387 A1* | 10/2009 | Yarita | G02F 1/1345 345/55 |

(Continued)

FOREIGN PATENT DOCUMENTS

| | | |
|---|---|---|
| KR | 1020040107742 | 12/2004 |
| KR | 1020060022086 | 3/2006 |

(Continued)

*Primary Examiner* — Hoa C Nguyen
(74) *Attorney, Agent, or Firm* — F. Chau & Associates, LLC

(57) ABSTRACT

A display device includes a substrate including a peripheral area with an integrated circuit chip disposed therein. A first pad portion, overlaps the integrated circuit chip, and includes a plurality of first dummy terminals, and a plurality of first connecting terminals electrically connected to the integrated circuit chip. The plurality of first dummy terminals is not electrically connected to the integrated circuit chip. A second pad portion, disposed in the peripheral area, includes a plurality of second connecting terminals electrically connected to a printed circuit board. A plurality of first connecting wires electrically connect each of the plurality of first connecting terminals to one or more of the plurality of second connecting terminals. At least one of the plurality of first connecting terminals is disposed between the plurality of first dummy terminals. The plurality of first connecting wires is not electrically connected to the plurality of first dummy terminals.

19 Claims, 8 Drawing Sheets

(56) References Cited

U.S. PATENT DOCUMENTS

| | | | |
|---|---|---|---|
| 2012/0161805 A1* | 6/2012 | Jung | G09G 3/006 324/754.07 |
| 2012/0299888 A1* | 11/2012 | Kim | G02F 1/13452 345/205 |
| 2013/0077005 A1* | 3/2013 | Kim | G02F 1/13452 349/40 |
| 2015/0070616 A1* | 3/2015 | Ogasawara | G02F 1/1339 349/43 |
| 2015/0145847 A1* | 5/2015 | Kim | H01L 33/36 345/211 |

FOREIGN PATENT DOCUMENTS

| | | |
|---|---|---|
| KR | 1020070002278 | 1/2007 |
| KR | 1020070063310 | 6/2007 |

\* cited by examiner

DISPLAY DEVICE HAVING DUMMY TERMINALS

CROSS-REFERENCE TO RELATED APPLICATION

This application claims priority under 35 U.S.C. § 119 to Korean Patent Application No. 10-2015-0171534, filed in the Korean Intellectual Property Office on Dec. 3, 2015, the disclosure of which is incorporated by reference herein in its entirety.

TECHNICAL FIELD

The present invention relates to a display device. More particularly, the present invention relates to a display device having dummy terminals.

DISCUSSION OF THE RELATED ART

Generally known display devices include liquid crystal displays (LCD), plasma display panels (PDP), organic light emitting diode (OLED) displays, and the like.

In order to drive such display devices, integrated circuit chips may be mounted in a peripheral area of a substrate of the particular display device. However, lengths of connecting wires disposed between pad portions that are respectively connected to the integrated circuit chips and a printed circuit board (PCB) may be different from each other. Thus, signals transmitted through the longer of the connecting wires may be delayed with respect to the signals transmitted through the shorter connecting wires.

In addition, as a distance between adjacent connecting terminals is narrowed, terminals adjacent to each other may become short-circuited.

SUMMARY

According to an exemplary embodiment of the present invention, a display device includes a substrate including a peripheral area with an integrated circuit chip disposed therein, a first pad portion overlapping the integrated circuit chip, wherein the first pad portion includes a plurality of first dummy terminals, and a plurality of first connecting terminals electrically connected to the integrated circuit chip, wherein the plurality of first dummy terminals is not electrically connected to the integrated circuit chip, a second pad portion disposed in the peripheral area, wherein the second pad portion includes a plurality of second connecting terminals electrically connected to a printed circuit board, and a plurality of first connecting wires that electrically connect each of the plurality of first connecting terminals to one or more of the plurality of second connecting terminals, wherein at least one of the plurality of first connecting terminals is disposed between two of the plurality of first dummy terminals, and wherein the plurality of first connecting wires is not electrically connected to the plurality of first dummy terminals.

In an exemplary embodiment of the present invention, a length of each of the plurality of first connecting wires electrically connected to first connecting terminals of the plurality of first connecting terminals, disposed adjacent to one of the plurality of first dummy terminals, is about 100% to about 200% of a shortest distance between adjacent first connecting terminals and second connecting terminals.

In an exemplary embodiment of the present invention, the plurality of first connecting terminals is arranged in a line.

In an exemplary embodiment of the present invention, the second pad portion includes a second dummy terminal that is disposed between the plurality of second connecting terminals, wherein the plurality of first connecting wires is not electrically connected to the second dummy terminal, and wherein the second dummy terminal is not connected to the plurality of first connecting wires.

In an exemplary embodiment of the present invention, each of the plurality of first connecting wires, that are respectively electrically connected to a pair of second connecting terminals disposed adjacent to opposite sides of the second dummy terminal, are electrically connected to different first connecting terminals of the plurality of first connecting terminals.

In an exemplary embodiment of the present invention, two of the plurality of first dummy terminals are disposed adjacent to each other.

According to an exemplary embodiment of the present invention, a display device includes a substrate, a base film disposed on the substrate, an integrated circuit chip disposed on the base film, a first pad portion overlapping the integrated circuit chip on the base film, wherein the first pad portion includes a plurality of first dummy terminals, and a plurality of first connecting terminals that are electrically connected to the integrated circuit chip, wherein the plurality of first dummy terminals are not electrically connected to the integrated circuit chip, a second pad portion including a plurality of second connecting terminals that are disposed at an end of the base film, and a plurality of first connecting wires that electrically connect each of the plurality of first connecting terminals to one or more of the plurality of second connecting terminals, wherein at least one of the plurality of first connecting terminals is disposed between two of the first dummy terminals to which the first connecting wires are not electrically connected.

In an exemplary embodiment of the present invention, a length of each of the first connecting wires connected to the first connecting terminals, adjacent to the first dummy terminals, is about 100% to about 200% of a shortest distance between the adjacent first connecting terminals and second connecting terminals.

In an exemplary embodiment of the present invention, the plurality of first connecting terminals is arranged in a line.

In an exemplary embodiment of the present invention, the second pad portion includes a second dummy terminal that is disposed between the plurality of second connecting terminals, wherein the first connecting wires are not electrically connected to the second dummy terminal, and wherein the second dummy terminal is not connected to the plurality of first connecting wires.

In an exemplary embodiment of the present invention, two of the plurality of first dummy terminals are disposed adjacent to each other.

In an exemplary embodiment of the present invention, the first connecting wires that are respectively connected to a pair of second connecting terminals, disposed adjacent to opposite sides of the second dummy terminal, are connected to different first connecting terminals.

In an exemplary embodiment of the present invention, the base film is flexible.

According to an exemplary embodiment of the present invention, a display device includes a substrate that includes a peripheral area and a display area, wherein an integrated circuit chip is disposed in the peripheral area, a first pad portion overlapping the integrated circuit chip, wherein the first pad portion includes a plurality of first dummy terminals, and a plurality of first connecting terminals that are electrically connected to the integrated circuit chip, wherein the first dummy terminals are not electrically connected to the integrated circuit chip, a second pad portion that is disposed in the peripheral area, wherein the second pad portion includes a plurality of second connecting terminals electrically connected to a printed circuit board, and a plurality of first connecting wires, wherein each of the plurality of first connecting wires electrically connects one of the plurality of first connecting terminals with at least one of the plurality of second connecting terminals, wherein one of the plurality of first dummy terminals is disposed between two first connecting terminals of the plurality of first connecting terminals.

In an exemplary embodiment of the present invention, a distance between the one of the plurality of first dummy terminals and one of the plurality of second connecting terminals that is closest to the one of the plurality of first dummy terminals is a first distance, and a length of each of the plurality of first connecting wires that electrically connect the two first connecting terminals with respective second connecting terminals of the plurality of second connecting terminals is about 100% to about 200% of the first distance.

In an exemplary embodiment of the present invention, the second pad portion includes a second dummy terminal that is disposed between two adjacent second connecting terminals of the plurality of second connecting terminals, wherein the second dummy terminal is not electrically connected to any of the plurality of first connecting wires.

In an exemplary embodiment of the present invention, the plurality of first connecting wires, that are electrically connected to the two adjacent second connecting terminals of the plurality of second connecting terminals, are each electrically connected to different first connecting terminals of the plurality of first connecting terminals.

In an exemplary embodiment of the present invention, a distance between the one of the plurality of first dummy terminals and one of the plurality of second connecting terminals that is closest to the one of the plurality of first dummy terminals is a first distance, and a length of each of the plurality of first connecting wires that are electrically connected to the two adjacent second connecting terminals of the plurality of second connecting terminals is about 100% to about 200% of the first distance.

In an exemplary embodiment of the present invention, the plurality of first connecting terminals is arranged along a first direction.

In an exemplary embodiment of the present invention, two of the plurality of first dummy terminals are disposed adjacent to each other.

BRIEF DESCRIPTION OF THE DRAWINGS

The above and other features and aspects of the present invention will become more apparent by describing in detail exemplary embodiments thereof with reference to the accompanying drawings, in which.

DETAILED DESCRIPTION OF THE EMBODIMENTS

Figure 1:
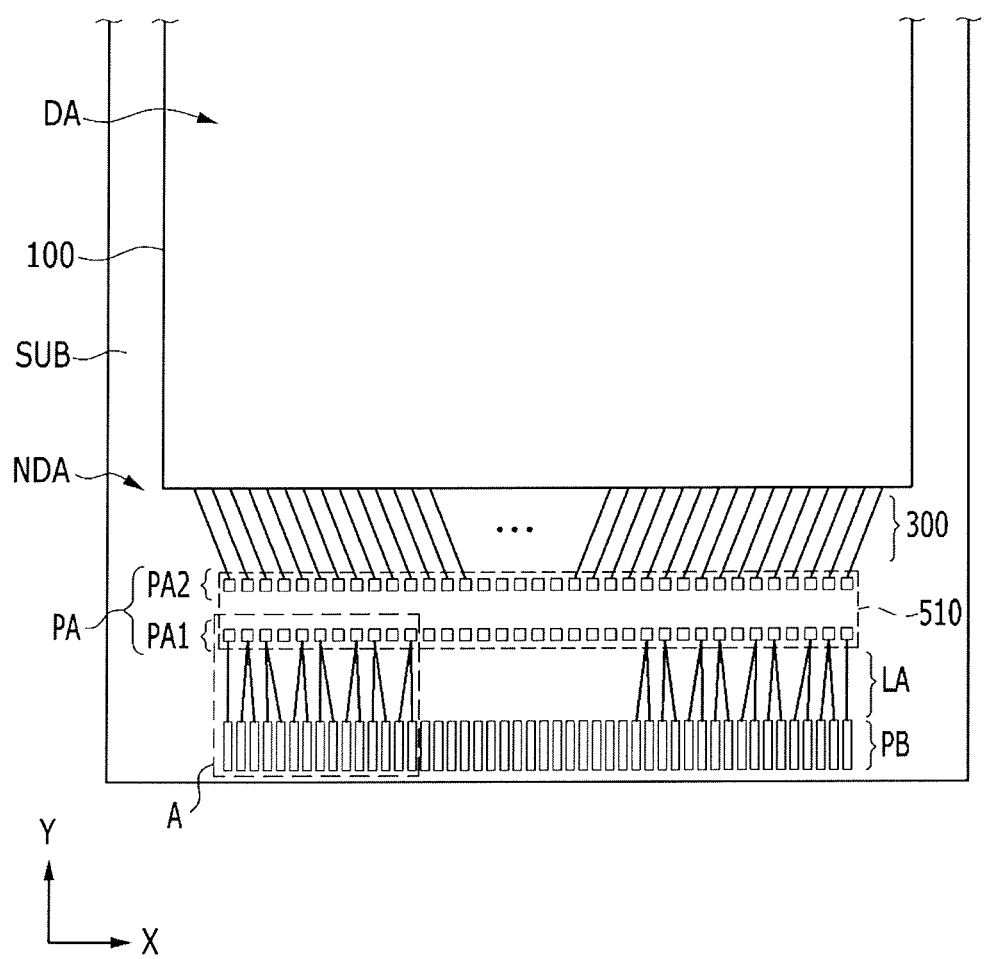
FIG. 1 is a partial top plan view illustrating a display device according to an exemplary embodiment of the present invention.

The present invention will be described more fully hereinafter with reference to the accompanying drawings. As those skilled in the art would realize, the described embodiments may be modified in various different ways without departing from the spirit and scope of the present invention. Like reference numerals may refer to like elements throughout the specification.

In the drawings, the thicknesses of elements, layers, films, panels, regions, etc., may be exaggerated for clarity. However, the present invention is not limited thereto. It will be understood that when an element such as a layer, film, region, or substrate is referred to as being "on" another element, it may be disposed directly on the other element or intervening elements may be disposed therebetween.

A display device according to an exemplary embodiment of the present invention will now be described with reference to FIG. 1 to FIG. 4.

Figure 2:
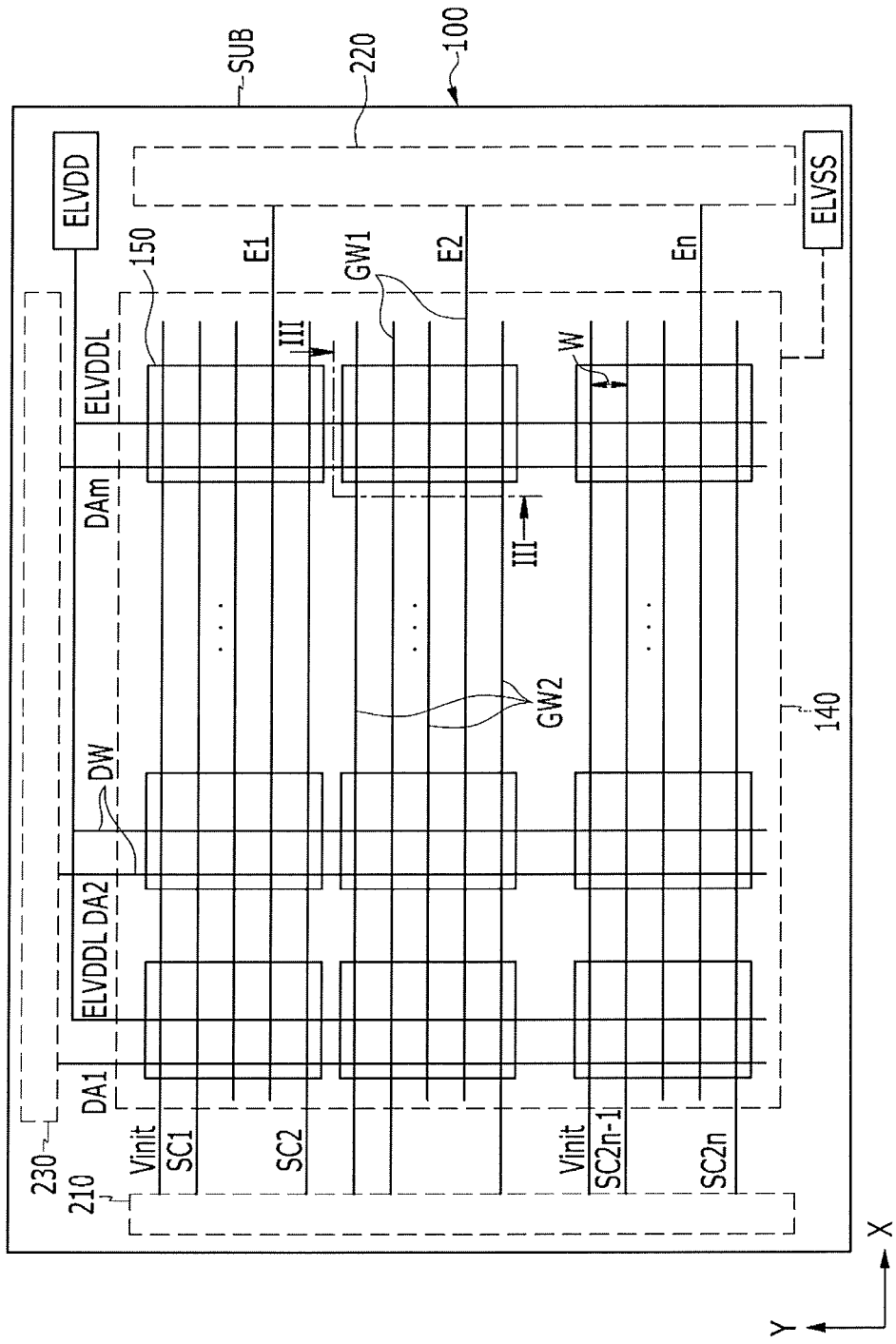
FIG. 2 is a schematic diagram illustrating a display area of FIG. 1, according to an exemplary embodiment of the present invention.
Figure 3:
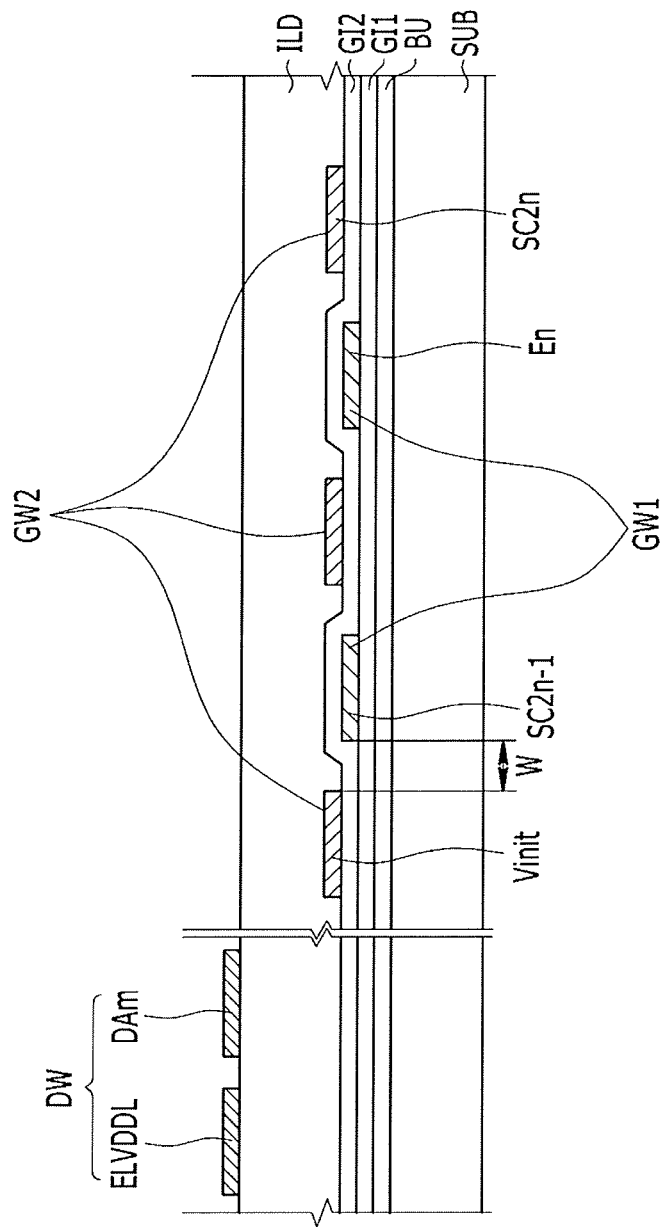
FIG. 3 is a cross-sectional view taken along line of FIG. 2, according to an exemplary embodiment of the present invention.
Figure 4:
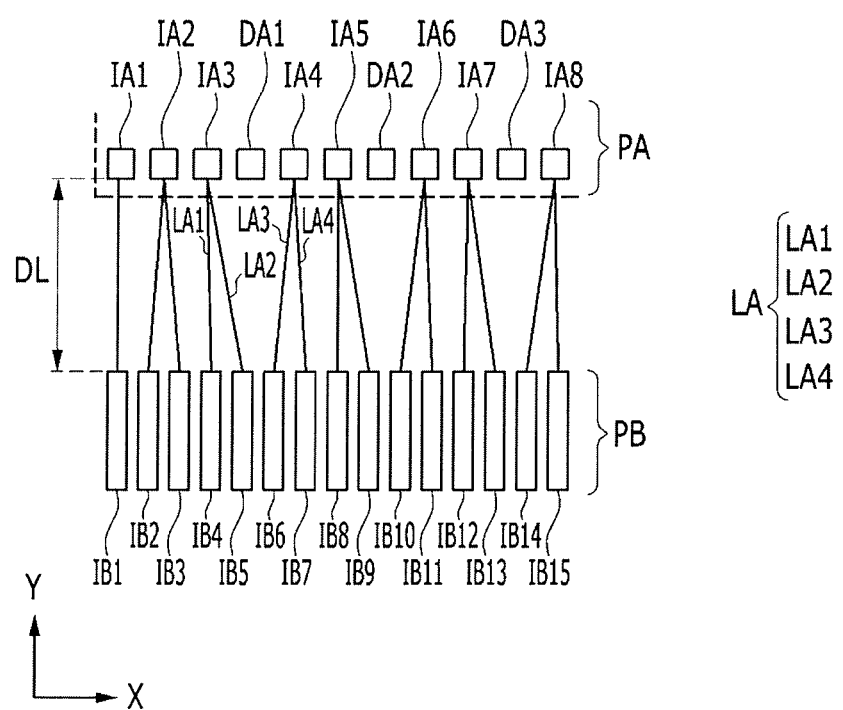
FIG. 4 is an enlarged view of region "A" of FIG. 1, according to an exemplary embodiment of the present invention.

FIG. 1 is a partial top plan view illustrating a display device according to an exemplary embodiment of the present invention. FIG. 2 is a schematic diagram illustrating a display area of FIG. 1, according to an exemplary embodiment of the present invention. FIG. 3 is a cross-sectional view taken along line of FIG. 2, according to an exemplary embodiment of the present invention. FIG. 4 is an enlarged view of region "A" of FIG. 1, according to an exemplary embodiment of the present invention.

Referring to FIG. 1 to FIG. 4, a display device according to an exemplary embodiment of the present invention includes a substrate (SUB), a display panel 100, an integrated circuit chip 510, a first pad portion (PA), a second pad portion (PB), and a plurality of first connecting wires (LA).

According to an exemplary embodiment, first dummy terminals (DA1, DA2, and DA3) to which the first connecting wires (LA) are not electrically connected may be disposed between some of a plurality of first connecting terminals (IA1-IA8) of the first pad portion (PA). According to an exemplary embodiment, the first dummy terminals (DA1, DA2, and DA3) are not electrically connected to the integrated circuit chip 510, and electrical signals do not pass through the first dummy terminals (DA1, DA2, and DA3). The plurality of first connecting terminals (IA1-IA8) may be electrically connected to the first connecting wires (LA). Accordingly, some of the plurality of first connecting terminals (IA1-IA8) may be disposed between the first dummy terminals (DA1, DA2, and DA3) to which the first connecting wires (LA) are not electrically connected. Thus, a length difference between the first connecting wires (LA) connecting the first pad portion (PA) and the second pad portion (PB) may be reduced.

Referring to FIG. 1, the substrate (SUB) includes a display area (DA) for displaying an image and a peripheral area (NDA) adjacent to the display area (DA). The display panel 100 may be disposed in the display area (DA). The display panel 100 may emit light. The integrated circuit chip 510 drives the display panel 100. The integrated circuit chip 510, the first pad portion (PA), the second pad portion (PB), fan-out wires 300 that connect the first pad portion (PA), and the plurality of first connecting wires (LA), may be disposed in the peripheral area (NDA). Hereinafter, components disposed on the substrate (SUB) will be described.

The display panel 100, disposed in the display area (DA) of the substrate (SUB), will be described in detail with reference to FIG. 2 and FIG. 3.

According to an exemplary embodiment, the display panel 100 includes first gate wires (GW1), second gate wires (GW2), data wires (DW), and pixels 150. The pixels 150 are disposed in a display unit 140.

A gate driver 210 sequentially supplies scan signals to first scan lines (SC2-SC2$n$) or second scan lines (SC1-SC2$n$-1) included in the first gate wires (GW1) or the second gate wires (GW2) according to a control signal provided by an external control circuit. The external control circuit may be, for example, a timing controller. Each pixel 150 is selected by a scan signal and sequentially receives data signals. Although the gate driver 210 may be disposed in the integrated circuit chip 510, it is shown in FIG. 2 for convenience of description.

The first gate wires (GW1) are disposed on the substrate (SUB) with a first insulating layer (GI1) disposed therebetween, and extend in a first direction. The first gate wires (GW1) include the second scan line (SC2$n$-1) and light emission lines (E1-En).

The second scan line (SC2$n$-1) is connected to the gate driver 210, and receives the scan signal from the gate driver 210. The light emission line (En) is connected to a light emission driver 220, and receives a light emission control signal from the light emission driver 220.

Although the light emission driver 220 may be disposed in the integrated circuit chip 510, the light emission driver 220 is shown in FIG. 2 for convenience of description. An x-axis represents the first direction and a y-axis represents a second direction in the accompanying drawings. The second direction crosses the first direction, and may be, for example, perpendicular to the first direction.

The second gate wires (GW2) are disposed on the first gate wires (GW1) with a second insulating layer (GI2) disposed therebetween. The second gate wires (GW2) extend in the first direction. The second gate wires (GW2) include the first scan line (SC2$n$) and an initialization power line (Vinit).

The first gate wires (GW1) and the second gate wires (GW2) do not overlap each other.

The first scan line (SC2$n$) is connected to the gate driver 210, and receives the scan signal from the gate driver 210. The initialization power line (Vinit) is connected to the gate driver 210, and receives an initialization power signal from the gate driver 210.

In an exemplary embodiment of the present invention, the initialization power line (Vinit) receives the initialization power signal from the gate driver 210, but the initialization power line (Vinit) may be connected to an additional element and may receive the initialization power signal from the additional element.

The light emission driver 220 sequentially supplies a light emission control signal to the light emission line (En) according to the control signal supplied from the external control circuit such as the timing controller. Thus, light emission by the pixels 150 is controlled by the light emission control signal.

For example, a light emission time of the pixels 150 is controlled by the light emission control signal. However, the light emission driver 220 may be omitted according to an inner structure of the pixels 150.

A data driver 230 transmits the data signal to a data line (DAm) among the data wires (DW) according to the control signal supplied from the external control circuit such as the timing controller. The data signal transmitted to the data line (DAm) is transmitted to a pixel 150 selected by the scan signal when the scan signal is transmitted to the first scan line (SC2$n$) or the second scan line (SC2$n$-1). Then, the pixel 150 charges a voltage corresponding to the data signal, and emits light with corresponding luminance. Herein, although the data driver 230 may be disposed in the integrated circuit chip 510, the data driver 230 is shown in FIG. 2 for convenience of description.

The data wires (DW) are disposed on the second gate wires (GW2) with a third insulating layer (ILD) disposed therebetween, and extend in the second direction crossing the first direction. The data wires (DW) include data lines (DA1-DAm) and a driving power line (ELVDDL). The data line (DAm) is connected to the data driver 230, and receives the data signal from the data driver 230. The driving power line (ELVDDL) is connected to an external first power source (ELVDD), and receives the driving power from the first power source (ELVDD).

In this case, the driving power line (ELVDDL) and the data line (DAm) may be formed of the same layer on the third insulating layer (ILD). However, the present invention is not limited thereto, and the driving power line (ELVDDL) and the data line (DAm) may be separately formed of different layers. For example, the driving power line (ELVDDL) may be formed of the same layer as the first gate wires (GW1), and the data line (DAm) may be formed of the same layer as the second gate wires (GW2).

The driving power line (ELVDDL) may be formed of the same layer as the second gate wires (GW2), and the data line (DAm) may be formed of the same layer as the first gate wires (GW1). The display unit 140 includes the first gate wires (GW1), the second gate wires (GW2), and the plurality of pixels 150. The plurality of pixels 150 may be positioned at a region of the display unit 140 where the first and second gate wires (GW1 and GW2) cross the data wires (DW).

Each pixel 150 includes an organic light emitting element with luminance corresponding to a driving current of the data signal. Each pixel 150 includes a pixel circuit for controlling a driving current applied to the organic light emitting element. The pixel circuit is connected to the respective first gate wires (GW1), the respective second gate wires (GW2), and the respective data wires (DW). The organic light emitting element is connected to the pixel circuit. The pixels 150 are described as including organic light emitting elements. However, the pixels 150 of a display device are not limited thereto. For example, according to an exemplary embodiment, the pixels 150 may include a liquid crystal display element, an electrophoretic display element, or the like.

An organic light emitting element of the display unit 140 is electrically connected to the external first power source (ELVDD) with the pixel circuit disposed therebetween. The organic light emitting element is electrically connected to a second power source (ELVSS). The first power source (ELVDD) and the second power source (ELVSS), respectively, supply drive power and common power to the pixels 150 of the display 140. The pixels 150 emit light with luminance that corresponds to the driving current passing through the organic light emitting element from the first power source (ELVDD). This current corresponds to the data signal according to the drive power and the common power supplied to the pixels 150.

In a display device according to an exemplary embodiment of the present invention, the first gate wires (GW1) including the second scan line (SC2n-1) and light emission line (En), that cross the pixels 150 in the first direction and that are not overlapped with each other, and the second gate wires (GW2) including the first scan line (SC2n) and the initialization power line (Vinit), are not provided on the same layer. The first gate wires (GW1) and the second gate wires (GW2) are respectively provided on different layers with the second insulation layer (GI2) disposed therebetween. Accordingly, a distance (W) between the neighboring gate wires provided on different layers may be further decreased and a greater number of pixels 150 can be formed in the same area. Thus, a high-resolution display device may be formed.

Referring back to FIG. 1, the integrated circuit chip 510 is provided in the peripheral area (NDA) on the substrate (SUB). The integrated circuit chip 510 may generate the driving signal. In an exemplary embodiment, the integrated circuit chip 510 may be provided as a chip-on-glass (COG) in the peripheral area (NDA) of the substrate (SUB).

In this case, the integrated circuit chip 510 may include a data driving circuit or a scan driving circuit that may receive an external control signal and then may generate the scan signal or the data signal. For example, the gate driver 210 or data driver 230 may be formed in the integrated circuit chip 510.

The integrated circuit chip 510 is electrically connected to the first pad portion (PA) disposed in the peripheral area (NDA) of the substrate (SUB). In this case, the first pad portion (PA) overlaps the integrated circuit chip 510.

The first pad portion (PA) includes a first node (PA1) and a second node (PA2). The integrated circuit chip 510 is electrically connected to the first node (PA1) and the second node (PA2). The first node (PA1) receives an external control signal and then transmits it to the integrated circuit chip 510. The second node (PA2) transmits a signal generated by the integrated circuit chip 510 to the display panel 100.

Referring to FIG. 1 and FIG. 4, the first pad portion (PA) includes the plurality of first connecting terminals (IA1-IA8) and the plurality of first dummy terminals (DA1, DA2, and DA3). Herein, the plurality of first connecting terminals (IA1-IA8) and the plurality of first dummy terminals (DA1, DA2, and DA3) may be disposed in the first node (PA1) of FIG. 1 described above.

In this case, the plurality of first connecting terminals (IA1-IA8) may be arranged in series to be electrically connected to the integrated circuit chip 510 and the first connecting wires (LA). According to an exemplary embodiment of the present invention, the plurality of first connecting terminals (IA1-IA8) may be disposed along the first direction. For example, the plurality of first connecting terminals (IA1-IA8) may be arranged in a line. The plurality of first connecting terminals (IA1-IA8) may be disposed to be overlapped with the integrated circuit chip 510 in a vertical direction. The plurality of first connecting terminals (IA1-IA8) may be electrically connected with the integrated circuit chip 510. The vertical direction may cross the first and second directions.

The plurality of first connecting wires (LA) electrically connect each of the plurality of first connecting terminals (IA1-IA8) of the first pad portion (PA) to each of a plurality of second connecting terminals (IB1-IB15) of the second pad portion (PB).

For example, a first connecting wire (LA1) of the plurality of first connecting wires (LA) electrically connects a first connecting terminal (IA3) of the plurality of first connecting terminals (IA1-IA8) to a second connecting terminal (IB4) of the plurality of second connecting terminals (IB1-IB15). A first connecting wire (LA2) of the plurality of first connecting wires (LA) electrically connects the first connecting terminal (IA3) of the plurality of first connecting terminals (IA1-IA8) to a second connecting terminal (IB5) of the plurality of second connecting terminals (IB1-IB15). A first connecting wire (LA3) of the plurality of first connecting wires (LA) electrically connects a first connecting terminal (IA4) of the plurality of first connecting terminals (IA1-IA8) to a second connecting terminal (IB6) of the plurality of second connecting terminals (IB1-IB15). A first connecting wire (LA4) of the plurality of first connecting wires (LA) electrically connects the first connecting terminal (IA4) of the plurality of first connecting terminals (IA1-IA8) to a second connecting terminal (IB7) of the plurality of second connecting terminals (IB1-IB15).

In this case, two first connecting wires (LA1 and LA2) are electrically connected to the first connecting terminal (IA3), and two first connecting wires (LA3 and LA4) are electrically connected to the first connecting terminal (IA4). For example, one or more first connecting wires (LA) may be electrically connected to each of the plurality of first connecting terminals (IA1-IA8) of the first pad portion (PA).

When the one or more first connecting wires (LA) are electrically connected to each of the plurality of first connecting terminals (IA1-IA8) of the first pad portion (PA), the control signal received from an external source may be prevented from being lost due to the first connecting wires (LA) being damaged or due to one of the first connecting wires (LA) being broken or disconnected. For example, even if a signal is not transmitted due to damage, breakage or disconnection of some of the first connecting wires (LA), a control signal may be transmitted through other first connecting wires (LA).

The second pad portion (PB) is electrically connected to the first pad portion (PA) through the first connecting wires (LA). The second pad portion (PB) may include the plurality of second connecting terminals (IB1-IB15). The second pad portion (PB) may be disposed at one end of the peripheral area (NDA), and may be electrically connected with a printed circuit board (PCB) transmitting the external control signal.

According to an exemplary embodiment, in the first pad portion (PA), some of the plurality of first connecting terminals (IA1-IA8) may be disposed between the first dummy terminals (DA1, DA2, and DA3), to which the first connecting wires (LA) are not electrically connected. For example, first connecting terminals (IA4 and IA5) are disposed between the first dummy terminal (DA1) and the first dummy terminal (DA2) of the first dummy terminals (DA1, DA2, and DA3). Further, first connecting terminals (IA6 and IA7) of the plurality of first connecting terminals (IA1-IA8) are disposed between the first dummy terminal (DA2) and the first dummy terminal (DA3) of the first dummy terminals (DA1, DA2, and DA3).

As described above, when the first connecting terminals (IA4 and IA5) of the plurality of first connecting terminals (IA1-IA8) are disposed between the first dummy terminal (DA1) and the first dummy terminal (DA2), a length difference between the first connecting wires (LA) connecting the first connecting terminals (IA1-IA8) and the second connecting terminals (IB1-IB15) may be reduced.

In FIG. 4, if the first dummy terminal (DA1) of the first dummy terminals (DA1, DA2, and DA3) is not disposed between the first connecting terminal (IA3) of the plurality of first connecting terminals (IA1-IA8) and first connecting terminal (IA4), the first connecting terminal (IA4), to which the first connecting wire (LA3) and the first connecting wire (LA4) of the plurality of first connecting wires (LA) are electrically connected, moves to the left. At the same time, each of the second connecting terminals (IB1 to IB15) remains in the same place, as shown in FIG. 4. For example, the second connecting terminals (IB1 to IB15) do not move. When the first connecting terminal (IA4) moves to the left and the second connecting terminals (IB6 and IB7) do not move, the distance between the second connecting terminals (IB6 and IB7) and the moved first connecting terminal (IA4) may increase.

Accordingly, when the first connecting terminal (IA4) of the plurality of first connecting terminals (IA1-IA8) moves (e.g., moves to the left) to a position of the first dummy terminal (DA1) of the first dummy terminals (DA1, DA2, and DA3), the lengths of the first connecting wire (LA3) and the first connecting wire (LA4) of the plurality of first connecting wires (LA) may be longer than the lengths of the first connecting wires (LA3 and LA4) when the first dummy terminal (DA1) is disposed in the first pad portion (PA) as shown in FIG. 4. This is because the distance between the second connecting terminals (IB6 and IB7) and the first connecting terminal IA4 may increase when the connecting terminal (IA4) moves to the left.

As a result, according to an exemplary embodiment of the present invention, by disposing the first dummy terminal (DA1) between the first connecting terminal (IA3) and the first connecting terminal (IA4) of the plurality of first connecting terminals (IA1-IA8), a length difference between the first connecting wires (LA3 and LA4) and the first connecting wires (LA1 and LA2), adjacent to the first connecting wires (LA3 and LA4), may be reduced. When a length difference between the first connecting wires (LA) connecting the first pad portion (PA) and the second pad portion (PB) increases, the control signal received from an external source may be delayed by the first connecting wires (LA) with a relatively long length.

Accordingly, in an exemplary embodiment of the present invention, when the first dummy terminal (DA1) of first dummy terminals (DA1, DA2, and DA3) is disposed between the first connecting terminal (IA3) and the first connecting terminal (IA4) of the plurality of first connecting terminals (IA1-IA8), a delay of the control signal transmitted to the display panel from an external source may be prevented by decreasing the length difference between the first connecting wires LA.

In this case, when the first dummy terminals are disposed between the first connecting terminals, the first connecting wires (LA) may extend so that the lengths of the first connecting wires (LA) may be close to a shortest distance (DL) between the adjacent first connecting terminals (IA1-IA8) and second connecting terminals (IB1-IB15).

According to an exemplary embodiment of the present invention, the first dummy terminals (DA1, DA2, and DA3), to which the first connecting wires (LA) are not electrically connected, are disposed between some of the plurality of first connecting terminals (IA1-IA8) so that the lengths of the first connecting wires (LA) may be about 100% to about 200% of the shortest distance (DL). When the lengths of the first connecting wires (LA) are within about 100% to about 200% of the shortest distance (DL), the control signal transmitted to the display panel from an external source through the first connecting wires (LA) may be prevented from being delayed.

Figure 5:
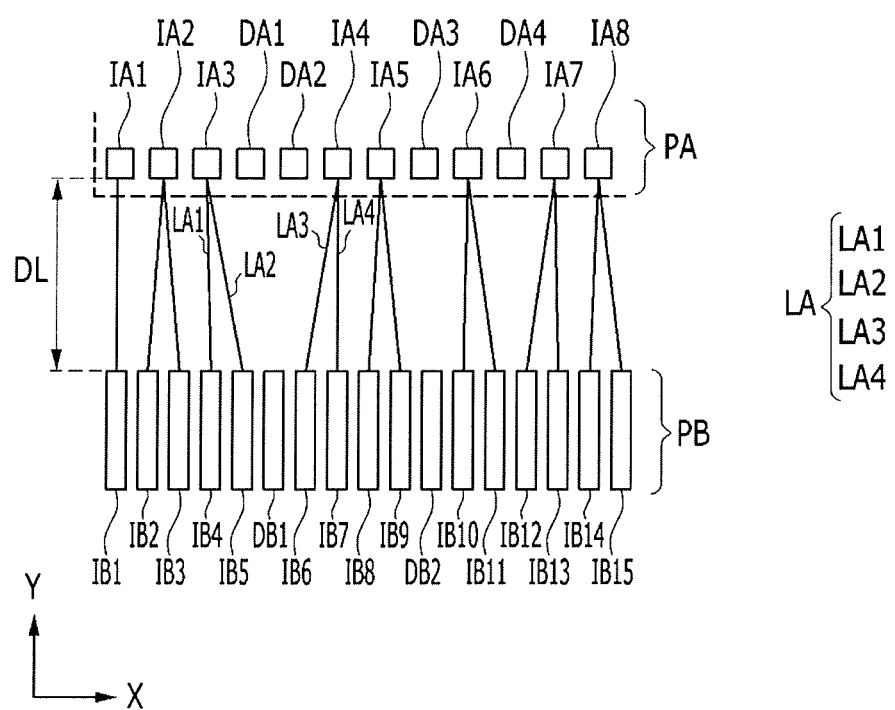
FIG. 5 illustrates variations of first and second pad portions of FIG. 4, according to an exemplary embodiment of the present invention.

FIG. 5 illustrates variations of first and second pad portions of FIG. 4, according to an exemplary embodiment of the present invention. In describing the display device of FIG. 5, a detailed description of components already described may be omitted for brevity.

Referring to FIG. 5, the second pad portion (PB) may further include second dummy terminals (DB1 and DB2) disposed between the plurality of second connecting terminals (IB1-IB15). Unlike the plurality of second connecting terminals (IB1-IB15), the second dummy terminals (DB1 and DB2) are not connected to the first connecting wires (LA). According to an exemplary embodiment, the second dummy terminals (DA1, DA2, and DA3) do not pass the external control signal.

According to an exemplary embodiment of the present invention, the first connecting wires (LA2 and LA3), respectively, that are electrically connected to a pair of second connecting terminals (IB5 and IB6), are disposed adjacent to opposite sides of the second dummy terminal (DB1). The first connecting wires (LA2 and LA3) are electrically connected to the different first connecting terminals (IA3 and IA4). For example, the first connecting wire (LA2), which is electrically connected to the second connecting terminal (IB5) of the plurality of second connecting terminals (IB1-IB15), is electrically connected to the first connecting terminal (IA3) of the plurality of first connecting terminals (IA1-IA8). The first connecting wire (LA3), which is electrically connected to the second connecting terminal (IB6) of the plurality of second connecting terminals (IB1-IB15), is electrically connected to the first connecting terminal (IA4) of the plurality of first connecting terminals (IA1-IA8).

The second connecting terminal (IB5) and the second connecting terminal (IB6) may receive different control signals from an external source, and transmit the received control signals to the display panel through different paths, for example, through the different first connecting wires (LA2 and LA3).

However, when the second connecting terminal (IB5) and the second connecting terminal (IB6) are short-circuited to each other, a control signal cannot be transmitted via either terminal. In an exemplary embodiment, by disposing the second dummy terminal (DB1) between the second connecting terminal (IB5) and the second connecting terminal (IB6), the second connecting terminal (IB5) and the second connecting terminal (IB6) may be prevented from being short-circuited to each other.

When the second dummy terminal (DB1) of the second dummy terminals (DB1 and DB2) is disposed between the second connecting terminal (IB5) and the second connecting terminal (IB6), the lengths of the first connecting wires (LA3 and LA4) may increase. When the lengths of the first connecting wires (LA3 and LA4) increase, they may be different from the lengths of the first connecting wires (LA1 and LA2) adjacent thereto. In this case, in order to prevent occurrence of a signal delay due to the length increase of the first connecting wires (LA3 and LA4), unlike as shown in FIG. 4, two first dummy terminals (DA1 and DA2) may be disposed between the first connecting terminal (IA3) and the first connecting terminal (IA4).

Hereinafter, a display device according to an exemplary embodiment of the present invention will be described with reference to FIG. 6 and FIG. 7. In describing the display device of FIG. 6 and FIG. 7, a detailed description of components already described may be omitted for brevity.

Figure 6:
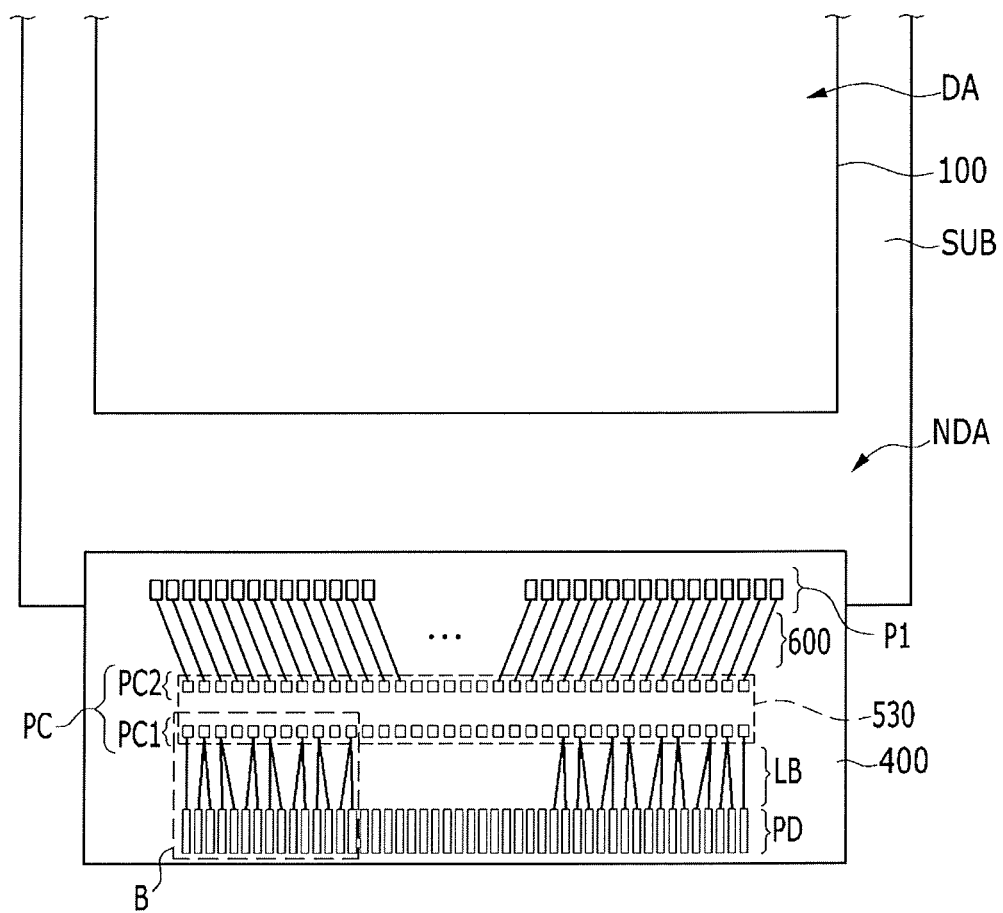
FIG. 6 is a partial top plan view illustrating a display device according to an exemplary embodiment of the present invention.

FIG. 6 is a partial top plan view illustrating a display device according to an exemplary embodiment of the present invention. FIG. 7 is an enlarged view of region "B" of FIG. 6, according to an exemplary embodiment of the present invention.

Figure 7:
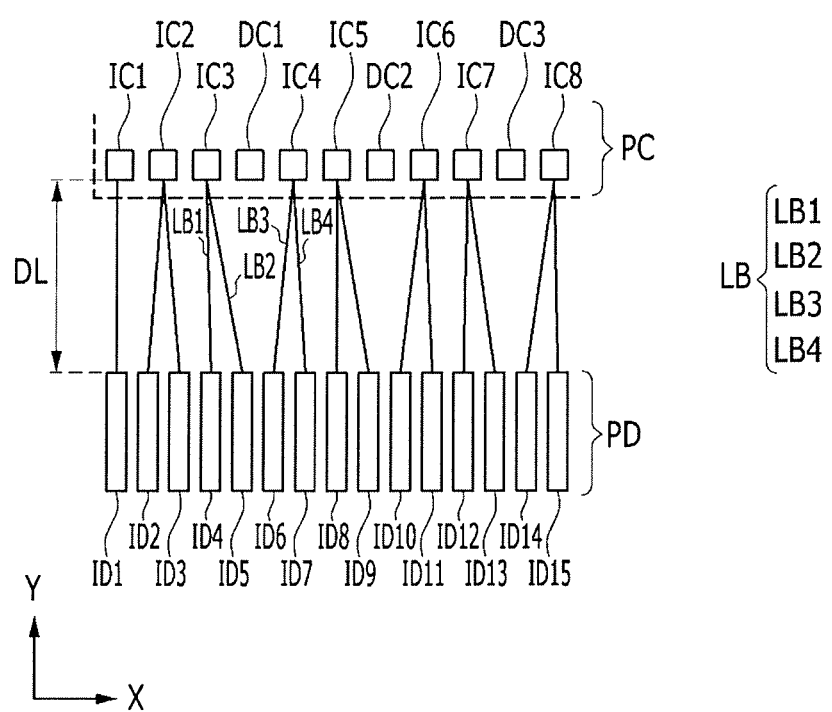
FIG. 7 is an enlarged view of region "B" of FIG. 6, according to an exemplary embodiment of the present invention.

Referring to FIG. 6 and FIG. 7, a display device, according to an exemplary embodiment of the present invention, includes the substrate (SUB), the display panel 100, a base film 400, an integrated circuit chip 530, a third pad portion (PC), a fourth pad portion (PD), a plurality of second connecting wires (LB), an a plurality of third connecting wires 600.

According to an exemplary embodiment, third dummy terminals (DC1, DC2, and DC3), to which the second connecting wires (LB) are not electrically connected, may be disposed between some of a plurality of third connecting terminals (IC1-IC8) of the third pad portion (PC). According to an exemplary embodiment, the third dummy terminals (DC1, DC2, and DC3) are not electrically connected to the integrated circuit chip 530, and the third dummy terminals (DC1, DC2, and DC3) do not pass electrical signals. The plurality of third connecting terminals (IC1-IC8) are electrically connected to the second connecting wires (LB). As a result, some of the plurality of third connecting terminals (IC1-IC8) may be disposed between the third dummy terminals (DC1, DC2, and DC3) to which the second connecting wires (LB) are not electrically connected. Accordingly, a length difference between the second connecting wires (LB) connecting the third pad portion (PC) and the fourth pad portion (PD) may be reduced.

According to an exemplary embodiment of the present invention, the base film 400 is flexible. The base film 400 is provided at one end of the peripheral area (NDA) of the substrate (SUB). The integrated circuit chip 530 that may generate a driving signal is disposed in the base film 400. In this case, the base film 400 may be connected to the substrate (SUB) through a fifth pad portion (P1) formed in the base film 400. In an exemplary embodiment, the integrated circuit chip 530 may be a chip-on-film (COF) formed on the base film 400.

In this case, the integrated circuit chip 530 may include a data driving circuit or a scan driving circuit that may receive an external control signal and then may generate the scan signal or the data signal. For example, the aforementioned gate driver 210 or data driver 230 may be formed in the integrated circuit chip 530.

The integrated circuit chip 530 is electrically connected to the third pad portion (PC) disposed at the base film 400. In this case, the third pad portion (PC) overlaps the integrated circuit chip 530.

The third pad portion (PC) includes a third node (PC1) and a fourth node (PC2). The integrated circuit chip 530 is electrically connected to the third node (PC1) and the fourth node (PC2). The third node (PC1) receives an external control signal and transmits the external control signal to the integrated circuit chip 530. The fourth node (PC2) transmits a signal generated from the integrated circuit chip 530 to the display panel 100 through the third connecting wires 600 and the fifth pad portion (P1).

The third pad portion (PC) includes the plurality of third connecting terminals (IC1-IC8) and the plurality of third dummy terminals (DC1, DC2, and DC3). Herein, the plurality of third connecting terminals (IC1-IC8) and the plurality of third dummy terminals (DC1, DC2, and DC3) may be disposed at the third node (PC1) of FIG. 6.

In this case, the plurality of third connecting terminals (IC1-IC8) may be arranged in one line to be electrically connected to the integrated circuit chip 530 and the second connecting wires (LB). The plurality of third connecting terminals (IC1-IC8) may overlap the integrated circuit chip 530 in a vertical direction to be electrically connected thereto.

The plurality of second connecting wires (LB) electrically connect the plurality of third connecting terminals (IC1-IC8) of the third pad portion (PC) to a plurality of fourth connecting terminals (ID1-ID15) of the fourth pad portion (PD).

For example, the second connecting wire (LB1) of the plurality of second connecting wires (LB) electrically connects the third connecting terminal (IC3) of the plurality of third connecting terminals (IC1-IC8) to the fourth connecting terminal (ID4) of the plurality of fourth connecting terminals (ID1-ID15). The second connecting wire (LB2) of the plurality of second connecting wires (LB) electrically connects the third connecting terminal (IC3) of the plurality of third connecting terminals (IC1-IC8) to the fourth connecting terminal (ID5) of the plurality of fourth connecting terminals (ID1-ID15). In addition, the second connecting wire (LB3) of the plurality of second connecting wires (LB) electrically connects the third connecting terminal (IC4) of the plurality of third connecting terminals (IC1-IC8) to the fourth connecting terminal (ID6) of the plurality of fourth connecting terminals (ID1-ID15). The second connecting wire (LB4) of the plurality of second connecting wires (LB) electrically connects the third connecting terminal (IC4) of the plurality of third connecting terminals (IC1-IC8) to the fourth connecting terminal (ID7) of the plurality of fourth connecting terminals (ID1-ID15).

In this case, one or more second connecting wires (LB) may be electrically connected to each of the third connecting terminals (IC1-IC8) of the third pad portion (PC).

When the one or more second connecting wires (LB) are electrically connected to each of third connecting terminals (IC1-IC8) of the third pad portion (PC), the control signal received from an external source may be prevented from being lost due to the second connecting wires (LB) being damaged or due to one of the second connecting wires (LB) being broken or disconnected. For example, even if a signal is not transmitted due to damage, breakage or disconnection of some of the second connecting wires (LB), a control signal may be transmitted through other second connecting wires (LB).

The fourth pad portion (PD), which is electrically connected to the third pad portion (PC) through the second connecting wires (LB), may include the plurality of fourth connecting terminals (ID1-ID15). The fourth pad portion (PD) may be provided at one end of the base film 400 to be electrically connected to a PCB transmitting the external control signal.

According to an exemplary embodiment, in the third pad portion (PC), some of the plurality of third connecting terminals (IC1-IC8) may be disposed between the third dummy terminals (DC1, DC2, and DC3) to which the second connecting wires (LB) are not electrically connected. For example, the third connecting terminals (IC4 and IC5) are disposed between the third dummy terminal (DC1) and the third dummy terminal (DC2) of the third dummy terminals (DC1, DC2, and DC3). In addition, the third connecting terminals (IC6 and IC7) of the plurality of third connecting terminals (IC1-IC8) are disposed between the third dummy terminal (DC2) and the third dummy terminal DC3 of the third dummy terminals (DC1, DC2, and DC3).

As described above, when the third connecting terminals (IC4 and IC5) of the plurality of third connecting terminals (IC1-IC8) are disposed between the third dummy terminal (DC1) and the third dummy terminal (DC2), a length difference between the second connecting wires (LB) electrically connecting the third connecting terminals (IC1-IC8) and the fourth connecting terminals (ID1-ID15) may be reduced.

Therefore, according to an exemplary embodiment of the present invention, by disposing the third dummy terminal (DC1) of the third dummy terminals (DC1, DC2, and DC3) between the third connecting terminal (IC3) and the third connecting terminal (IC4) of the plurality of third connecting terminals (IC1-IC8), a length difference between the second connecting wires (LB3 and LB4) and the second connecting wires (LB1 and LB2) adjacent to the second connecting wires (LB3 and LB4) may be reduced.

When the length difference between the second connecting wires (LB) connecting the third pad portion (PC) and the fourth pad portion (PD) increases, the control signal received from an external source through the second connecting wires (LB) may be delayed. Accordingly, in an exemplary embodiment of the present invention, when the third dummy terminal (DC1) is disposed between the third connecting terminal (IC3) and the third connecting terminal (IC4), the control signal transmitted to the display panel from an external source may be prevented from being delayed by reducing the length difference between the second connecting wires (LB) electrically connecting the third pad portion (PC) and the fourth pad portion (PD).

In this case, when the third dummy terminal is disposed between the plurality of third connecting terminals, the second connecting wires (LB) may extend such that the lengths of the second connecting wires (LB) may be close in size to a shortest distance (DL) between the adjacent third connecting terminals (IC1-IC8) and fourth connecting terminals (ID1-ID15).

Figure 8:
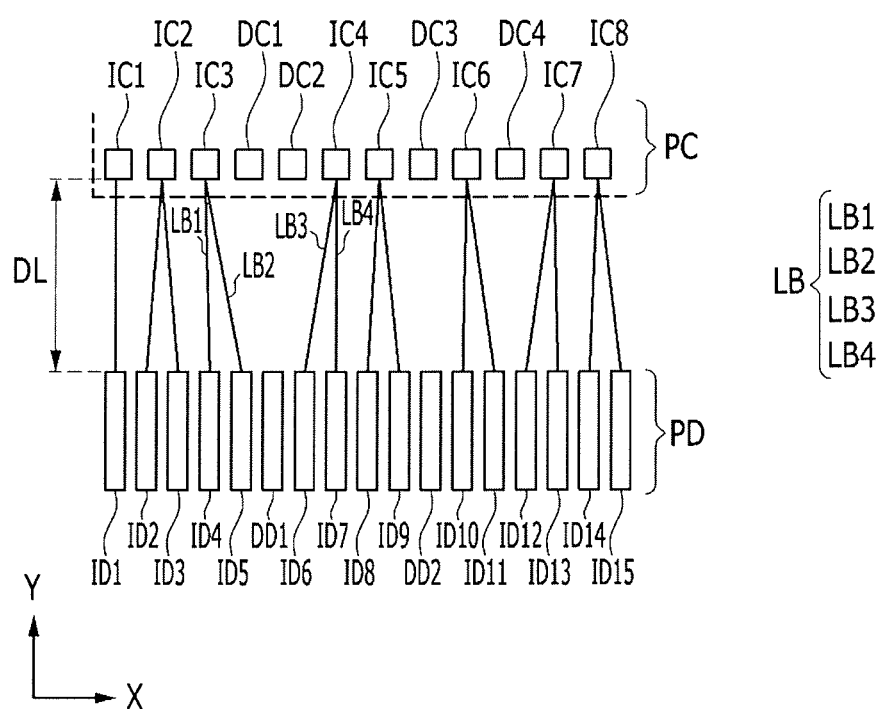
FIG. 8 illustrates variations of third and fourth pad portions of FIG. 7, according to an exemplary embodiment of the present invention.

According to an exemplary embodiment of the present invention, the third dummy terminals (DC1, DC2, and DC3), to which the second connecting wires (LB) are not electrically connected, are disposed between some of the plurality of third connecting terminals (IC1-IC8) so that the lengths of the second connecting wires (LB) may be about 100% to about 200% of the shortest distance (DL). When the length of the second connecting wires (LB) are disposed within about 100% to about 200% of the shortest distance (DL), the control signal transmitted to the display panel from an external source through the second connecting wires (LB) may be prevented from being delayed FIG. 8 illustrates variations of third and fourth pad portions of FIG. 7, according to an exemplary embodiment of the present invention. In describing the display device of FIG. 8, a detailed description of components already described may be omitted for brevity.

Referring to FIG. 8, the fourth pad portion (PD) may further include fourth dummy terminals (DD1 and DD2) disposed between the plurality of fourth connecting terminals (ID1-ID15). Unlike the plurality of fourth connecting terminals (ID1-ID15), the fourth dummy terminals (DD1 and DD2) are not electrically connected to the second connecting wires (LB). According to an exemplary embodiment, the fourth dummy terminals (DD1 and DD2) do not pass the external control signal.

According to an exemplary embodiment, the second connecting wires (LB2 and LB3) are electrically connected to the third connecting terminals (IC3 and IC4), respectively. The second connecting wires (LB2 and LB3), respectively, are electrically connected to a pair of fourth connecting terminals (ID5 and ID6), disposed adjacent to opposite sides of the fourth dummy terminal (DD1). For example, the second connecting wire (LB2), which is electrically connected to the fourth connecting terminal (ID5) of the plurality of fourth connecting terminals (ID1-ID15), is electrically connected to the third connecting terminal (IC3) of the plurality of third connecting terminals (IC1-IC8). The second connecting wire (LB3), which is electrically connected to the fourth connecting terminal (ID6) of the plurality of fourth connecting terminals (ID1-ID15), is electrically connected to the third connecting terminal (IC4) of the plurality of third connecting terminals (IC1-IC8).

The fourth connecting terminal (ID5) and the fourth connecting terminal (ID6) may receive different control signals from an external source, and transmits the received control signals to the display panel through different paths, for example, through different second connecting wires (LB2 and LB3).

However, when the fourth connecting terminal (ID5) and the fourth connecting terminal (ID6) are short-circuited to each other, the control signal cannot be transmitted via either terminal. In an exemplary embodiment, by disposing the fourth dummy terminal (DD1) between the fourth connecting terminal (ID5) and the fourth connecting terminal (ID6), the fourth connecting terminal (ID5) and the fourth connecting terminal (ID6) may be prevented from being short-circuited to each other.

When the fourth dummy terminal (DD1) of the fourth dummy terminals (DD1 and DD2) are disposed between the fourth connecting terminal (ID5) and the fourth connecting terminal (ID6), the lengths of the second connecting wires (LB3 and LB4) may increase. When the lengths of the second connecting wires (LB3 and LB4) increase, they may be different from the lengths of the second connecting wires (LB1 and LB2). In this case, in order to prevent occurrence of a signal delay due to the length increase of the second connecting wires (LB3 and LB4), unlike as shown in FIG. 7, two third dummy terminals (DC1 and DC2) may be disposed between the third connecting terminal (IC3) and the third connecting terminal (IC4).

In a display device, according to an exemplary embodiment of the present invention, by disposing the first dummy terminals (DA1, DA2, and DA3) between some of the first connecting terminals (IA1-IA8) of the first pad portion (PA), the length difference between the first connecting wires (LA) may be reduced. In addition, the delay of the control signal transmitted to the display panel from an external source may be prevented.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:
1. A display device, comprising:
a substrate including a peripheral area with an integrated circuit chip disposed therein;
a first pad portion overlapping the integrated circuit chip, wherein the first pad portion includes a plurality of first dummy terminals, and a plurality of first connecting terminals electrically connected to the integrated circuit chip;
a second pad portion disposed in the peripheral area, wherein the second pad portion includes a plurality of second connecting terminals electrically connected to a printed circuit board; and
a plurality of first connecting wires that electrically connect the plurality of first connecting terminals to the plurality of second connecting terminals,
wherein at least one of the plurality of first connecting terminals is disposed between two of the plurality of first dummy terminals, and wherein the plurality of first connecting wires is not electrically connected to the plurality of first dummy terminals.

2. The display device of claim 1, wherein
a length of each of the plurality of first connecting wires electrically connected to first connecting terminals of the plurality of first connecting terminals, disposed adjacent to one of the plurality of first dummy terminals, is about 100% to about 200% of a shortest distance between adjacent first connecting terminals and second connecting terminals.

3. The display device of claim 1, wherein
one or more first connecting wires are connected to each of the plurality of first connecting terminals.

4. The display device of claim 1, wherein
the plurality of first connecting terminals is arranged in a line.

5. The display device of claim 1, wherein
the second pad portion includes a second dummy terminal that is disposed between the plurality of second connecting terminals, wherein the plurality of first connecting wires is not electrically connected to the second dummy terminal.

6. The display device of claim 5, wherein
each of the plurality of first connecting wires, that are respectively electrically connected to a pair of second connecting terminals disposed adjacent to opposite sides of the second dummy terminal, are electrically connected to different first connecting terminals of the plurality of first connecting terminals.

7. A display device, comprising:
a substrate;
a base film disposed on the substrate;
an integrated circuit chip disposed on the base film;
a first pad portion overlapping the integrated circuit chip on the base film, wherein the first pad portion includes a plurality of first dummy terminals, and a plurality of first connecting terminals that are electrically connected to the integrated circuit chip;
a second pad portion including a plurality of second connecting terminals that are disposed at an end of the base film; and
a plurality of first connecting wires that electrically connect the plurality of first connecting terminals to the plurality of second connecting terminals,
wherein at least one of the plurality of first connecting terminals is disposed between two of the first dummy terminals to which the first connecting wires are not electrically connected.

8. The display device of claim 7, wherein
a length of each of the first connecting wires connected to the first connecting terminals, adjacent to the first dummy terminals, is about 100% to about 200% of a shortest distance between the adjacent first connecting terminals and second connecting terminals.

9. The display device of claim 7, wherein
one or more first connecting wires are connected to each of the plurality of first connecting terminals.

10. The display device of claim 7, wherein
the plurality of first connecting terminals is arranged in a line.

11. The display device of claim 7, wherein
the second pad portion includes a second dummy terminal that is disposed between the plurality of second connecting terminals, wherein the first connecting wires are not electrically connected to the second dummy terminal.

12. The display device of claim 11, wherein
the first connecting wires that are respectively connected to a pair of second connecting terminals, disposed adjacent to opposite sides of the second dummy terminal, are connected to different first connecting terminals.

13. The display device of claim 7, wherein
the base film is flexible.

14. A display device, comprising:
a substrate that includes a peripheral area and a display area, wherein an integrated circuit chip is disposed in the peripheral area;
a first pad portion overlapping the integrated circuit chip, wherein the first pad portion includes a plurality of first dummy terminals, and a plurality of first connecting terminals that are electrically connected to the integrated circuit chip;
a second pad portion that is disposed in the peripheral area, wherein the second pad portion includes a plurality of second connecting terminals electrically connected to a printed circuit board; and
a plurality of first connecting wires, wherein each of the plurality of first connecting wires electrically connects one of the plurality of first connecting terminals with at least one of the plurality of second connecting terminals,
wherein one of the plurality of first dummy terminals is disposed between two first connecting terminals of the plurality of first connecting terminals, and
wherein the second pad portion includes a second dummy terminal that is disposed between two adjacent second connecting terminals of the plurality of second connecting terminals, wherein the second dummy terminal is not electrically connected to any of the plurality of first connecting wires.

15. The display device of claim 14, wherein a distance between the one of the plurality of first dummy terminals and one of the plurality of second connecting terminals that is closest to the one of the plurality of first dummy terminals is a first distance, and a length of each of the plurality of first connecting wires that electrically connect the two first connecting terminals with respective second connecting terminals of the plurality of second connecting terminals is about 100% to about 200% of the first distance.

16. The display device of claim 14, wherein the plurality of first connecting wires, that are electrically connected to the two adjacent second connecting terminals of the plurality of second connecting terminals, are each electrically connected to different first connecting terminals of the plurality of first connecting terminals.

17. The display device of claim 16, wherein a distance between the one of the plurality of first dummy terminals and one of the plurality of second connecting terminals that is closest to the one of the plurality of first dummy terminals is a first distance, and a length of each of the plurality of first connecting wires that are electrically connected to the two adjacent second connecting terminals of the plurality of second connecting terminals is about 100% to about 200% of the first distance.

18. The display device of claim 14, wherein the plurality of first connecting terminals is arranged along a first direction.

19. The display device of claim 14, wherein two of the plurality of first dummy terminals are disposed adjacent to each other.

* * * * *